(12) United States Patent
Main et al.

(10) Patent No.: US 9,860,982 B1
(45) Date of Patent: Jan. 2, 2018

(54) ELECTRICAL CONNECTION OF ELECTRICAL WIRES TO FLEXIBLE CONDUCTIVE ELEMENTS

(71) Applicant: XSENSOR Technology Corporation, Calgary (CA)

(72) Inventors: Ian Main, Calgary (CA); Timothy Carl Gorjanc, Calgary (CA)

(73) Assignee: XSENSOR Technology Corporation, Calgary (CA)

( * ) Notice: Subject to any disclaimer, the term of this patent is extended or adjusted under 35 U.S.C. 154(b) by 0 days.

(21) Appl. No.: 15/442,699

(22) Filed: Feb. 26, 2017

(51) Int. Cl.
| | |
|---|---|
| H05K 1/09 | (2006.01) |
| H05K 3/32 | (2006.01) |
| H05K 1/05 | (2006.01) |
| H05K 1/03 | (2006.01) |
| H05K 3/46 | (2006.01) |
| H05K 1/02 | (2006.01) |

(52) U.S. Cl.
CPC ............... *H05K 1/09* (2013.01); *H05K 1/028* (2013.01); *H05K 1/038* (2013.01); *H05K 1/05* (2013.01); *H05K 3/32* (2013.01); *H05K 3/4644* (2013.01); *H05K 3/328* (2013.01); *H05K 2201/0129* (2013.01); *H05K 2201/0137* (2013.01); *H05K 2201/10227* (2013.01); *H05K 2203/11* (2013.01)

(58) Field of Classification Search
CPC .................................. H05K 1/09; H05K 3/32
See application file for complete search history.

(56) References Cited

U.S. PATENT DOCUMENTS

| | | | | |
|---|---|---|---|---|
| 5,336,255 A | * | 8/1994 | Kanare | A61N 1/0452 607/112 |
| 2012/0061135 A1 | * | 3/2012 | Hill | H05K 9/009 174/388 |
| 2016/0183367 A1 | * | 6/2016 | Liu | H05K 1/038 361/760 |
| 2016/0270700 A1 | * | 9/2016 | Baxi | A61B 5/1121 |

* cited by examiner

*Primary Examiner* — Jeremy C Norris
(74) *Attorney, Agent, or Firm* — Fenwick & West LLP

(57) ABSTRACT

A process makes electrical connections between electrical wires and flexible conductive elements, such as conductive fabrics. The process makes strong electrical connections that are mechanically flexible and can simultaneously create multiple electrical connections. The process involves creating an assembly that includes at least a TPE layer, an electrical wire, an insulating layer, and a flexible conductive element, and applying heat and pressure to the assembly. For example, a conductive fabric is disposed on an insulating layer, a wire is positioned onto a surface of the insulating layer, and a TPE layer is disposed over the wire and overlaps the conductive fabric element. When applying the heat and pressure, the wire melts through the insulating layer to make electrical contact with the conductive fabric element, and the TPE layer conforms to an exterior of the wire and bonds to the insulating layer.

20 Claims, 7 Drawing Sheets

ELECTRICAL CONNECTION OF ELECTRICAL WIRES TO FLEXIBLE CONDUCTIVE ELEMENTS

BACKGROUND

1. Technical Field

The present disclosure relates generally to making electrical connections between electrical wires and flexible conductive elements, such as conductive fabrics.

2. Background Information

Flexible conductive fabrics are used in medical devices, motor vehicles, consumer electronics devices, the Internet of things, wearable devices, and many others types of devices. Electrical wires are connected to flexible conductive fabrics in order to electrically connect the fabrics to other electrical elements and/or to route electricity through the fabrics, including for both power and signal transmission. Typically, electrical wires are connected to conductive fabrics by using solder, anisotropic adhesives, mechanical crimps, snaps, clamps, and the like. However, these connection methods form electrical connections that are bulky, inflexible, and structurally weak, and often compromise the reliability of devices using conductive fabrics. Moreover, processes for forming these types of electrical connections can be time consuming and labor intensive because the electrical connections are formed individually. For example, electrical wires may be individually bonded to conductive elements, one wire at a time.

Thus, there is a need for better approaches to make electrical connections between electrical wires and flexible conductive elements, including conductive fabrics.

SUMMARY

A process makes electrical connections between electrical wires and flexible conductive elements, such as conductive fabrics. The process makes strong electrical connections that are mechanically flexible and can simultaneously create multiple electrical connections. The process involves creating an assembly that includes at least a TPE layer, an electrical wire, an insulating layer, and a flexible conductive element, and applying heat and pressure to the assembly. For example, to create an assembly, a conductive fabric is disposed on an insulating layer, a wire is positioned onto a surface of the insulating layer, and a TPE layer is disposed over the wire and overlaps the conductive fabric element. When applying the heat and pressure, the wire melts through the insulating layer to make an electrical connection with the conductive fabric element. The TPE layer conforms to an exterior of the wire and bonds to the insulating layer thereby securely fixing the electrical connection between the wire and the conductive fabric element.

The figures depict various embodiments of the present disclosure for purposes of illustration only. One skilled in the art will readily recognize from the following discussion that alternative embodiments of the structures and methods illustrated herein may be employed without departing from the principles described herein.

DETAILED DESCRIPTION

Example Bonding Process

FIGS. 1A through 1D are cross-sectional views illustrating an example process of bonding electrical wires to flexible conductive elements of a conductive substrate, according to one embodiment. FIG. 1F is a flow chart of this example process. In this process, it is desired to make an electrical connection between an electrical wire 102 and a conductive fabric element 106 which is part of a conductive substrate 101.

Figure 1A:
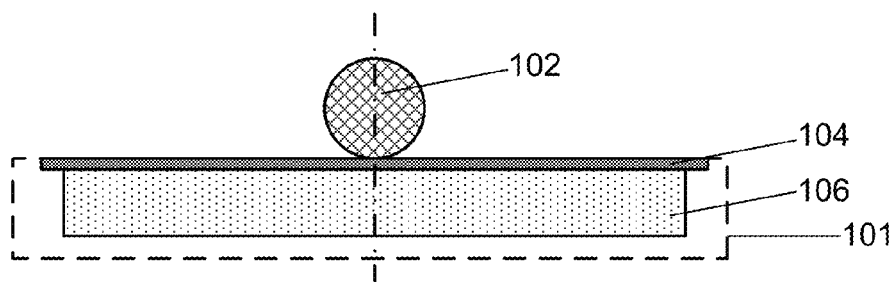
FIGS. 1A through 1D are cross-sectional views illustrating an example process of bonding electrical wires to flexible conductive elements of a conductive substrate, according to one embodiment.

In FIG. 1A, the electrical wire 102 is positioned 152 onto a conductive substrate 101. In this example, the conductive substrate 101 is the structure inside the dashed line. It includes a conductive fabric element 106 and an insulating layer 104 disposed on the conductive fabric element 106. The conductive fabric element 106 and the insulating layer 104 may be bonded together, or the insulating layer 104 may be laminated onto the conductive fabric element 106, or the insulating layer 104 and conductive fabric element 106 may be held in close proximity to each other, for example. For illustration purposes, only one conductive fabric element 106 and one insulating element 104 are shown in FIG. 1. In alternate embodiments, the conductive substrate 101 can include multiple conductive fabric elements 106 and/or multiple insulating elements 104. The conductive substrate 101 can also include other elements such as another insulating sheet, a stiffener for providing additional structural support, an external EMI shielding, a jumper to connect multiple conductive fabric elements. The conductive substrate may also include other layers or structures in addition to or in place of the insulating layer 104. The conductive substrate 101, the conductive fabric elements 106 and the insulating elements 104 can be of various shapes, sizes and dimensions.

The electrical wire 102 is positioned onto a surface of the insulating layer 104 that is opposite the conductive fabric element 106. The electrical wire 102 is positioned such that its outer surface is in contact with or in close proximity to the surface of the insulating layer 104 onto which the electrical wire 102 is positioned. The electrical wire 102 is positioned such that a segment of the electrical wire 102 that is to make an electrical connection with the conductive fabric element 106 overlaps the conductive fabric element 106. The electrical wire 102 is preferably positioned such that it is centered in the middle of the conductive fabric element 106. In one embodiment, only the segment of the electrical wire 102 that is to be electrically connected to the conductive fabric element 106 overlaps the conductive fabric element 106. In other embodiments, the segment of the electrical wire 102 that overlaps the conductive fabric element 106 includes a sub-segment that will not be electrically connected to the conductive fabric element 106. To keep the electrical wire 102 in position relative to the conductive substrate 101, the rest of the electrical wire 102 can be supported by a supporting surface (not shown) or held by tooling (not shown).

As illustrated in FIG. 1, the electrical wire 102 is shown with a circular cross-section. However, the electrical wire 102 can also have other cross-sectional shapes. The electrical wire 102 can be a single-strand wire (i.e., solid core wire) or a multi-strand wire (i.e., multiple individual strands twisted together). The wire conductor is a conductive material such as copper. The electrical wire 102 can also include an exterior jacket to provide insulation. A segment of the electrical wire 102 that is to be connected to the conductive fabric element 106 can be exposed (i.e., wire jacket is stripped) or can still be covered by a wire jacket.

When positioning 152 the electrical wire 102 onto the conductive substrate 101, the conductive substrate 101 can be supported by a supporting surface (not shown) such that the insulating layer 104 is exposed to allow the electrical wire 102 to be positioned onto the insulating layer 104. The conductive substrate 101 is held still while the electrical wire 102 is being positioned. In some embodiments, tooling holds the conductive substrate 101 while the electrical wire 102 is being positioned.

The conductive fabric element 106 is flexible and conductive. In FIG. 1, the conductive fabric element 106 is a long flat strip extending into the paper. It has a uniform cross-section area, such as the rectangle shown in FIG. 1. The conductive fabric element 106 can have other shapes and can be made of other materials including non-fabrics. Examples of flexible conductive fabrics include a conductive plastic, conventional thermoset or thermoplastic material loaded with a conductive filler or having a thin conducive coating, or a metalized fabric. The conductive fabric element 106 can be woven, non-woven, or knitted. The conductive fabric element 106 can include conductive materials such as metals, carbon, conductive polymers, conductive ink, conductive epoxy, conductive silicone, and the like. Metals can be electrochemically deposited, vacuum deposited, sputtered, dip coated, or screen printed onto fabrics. Example non-fabrics include plastics (e.g., kapton, mylar, PET, etc.), rubber-based elements (e.g., silicone, latex, urethane), paper, thin circuit boards, metal foils such as copper or aluminum. In one embodiment, the conductive fabric element 106 is encapsulated by insulating layers on both sides via a lamination process. The conductive fabric element 106 can also be manufactured by other manufacture processes such as spray coating, dip coating, or extrusion.

The illustrated insulating layer 104 is a sheet of a non-conductive material (e.g., polymers). The insulating layer 104 is preferably thin and flexible. In one embodiment, the insulating layer 104 is an elastomer such as polyurethane. Other materials such as urethanes, polyethylene, polypropylene, nylon, and polyester can also be used. The insulating layer 104 can be made of any dielectric materials that are flexible and have a melting temperature that are not high enough to destroy the conductive fabric element 106. As illustrated, the insulating layer 104 is thinner than and wider than the conductive fabric element 106. However, the dimensions and thickness of the insulating layer 104 and the conductive fabric element 106 can be selected according to different purposes. The thickness and material of the insulating layer 104 preferably is selected such that the insulating layer 104 can be melted through by a heat and pressure process used to form an electrical connection between the wire 102 and conductive fabric element 106 as further described with respect to FIGS. 1C through 1D.

Figure 1B:
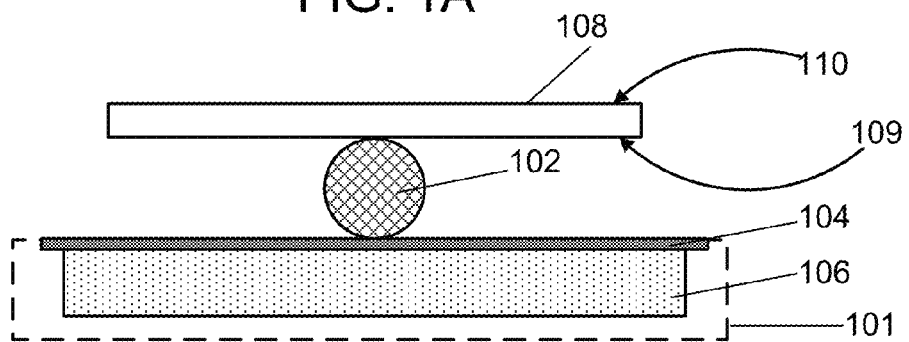
Figure 1C:
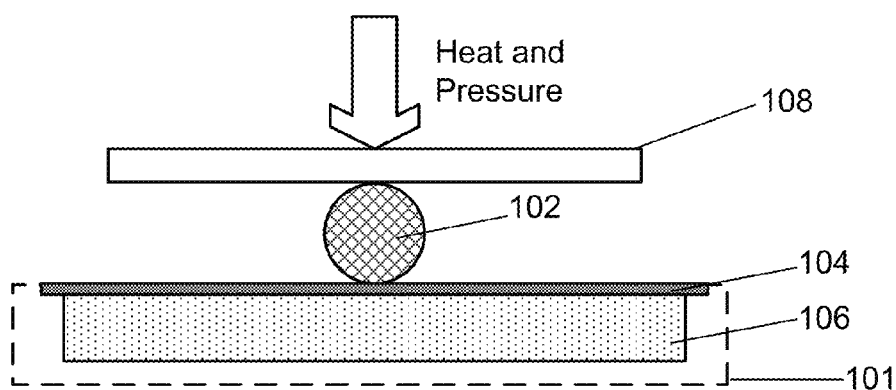
Figure 1D:
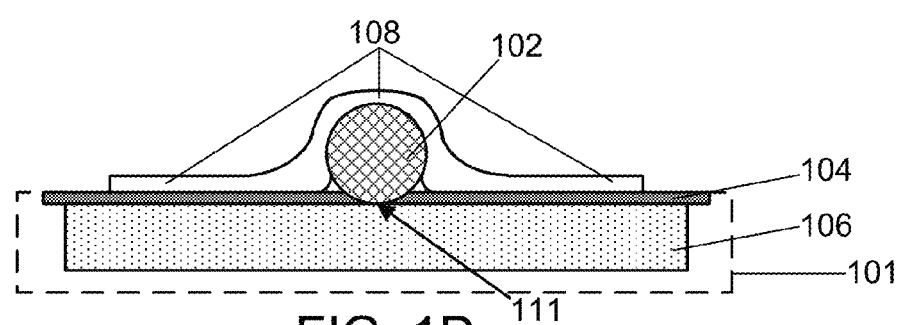

As illustrated in FIG. 1B, a thermoplastic elastomer (TPE) layer 108 is disposed 154 over the electrical wire 102 and overlapping at least a part of the conductive fabric element 106. The TPE layer 108 includes a sheet of thermoplastic elastomer. The TPE layer 108 may be positioned so that one or more of its border is aligned with the borders of the conductive fabric element 106, although that is not the case shown in FIG. 1. A surface 109 of the TPE layer 108 is in contact with an outer surface of the electrical wire 102 and in proximity to a surface of the insulating layer 104. One or both of the surface 109 and the surface 110 is adhesive. Adhesives are a bonding agent and can strengthen the bonding between the TPE layer 108 and the insulating layer 104 as further described below in connection with FIGS. 1C-1D. Adhesives such as Kapton, PET, or other types of acrylic adhesive that can withstand a heat and pressure process that is used to form electrical connections as further described with respect to FIGS. 1C-1D are used. The TPE layer 108 is illustrated in FIG. 1B as flat and natural deformation caused by gravity such as sagging is omitted for convenience. The TPE layer 108 is a non-conductive sheet that is preferably thin and flexible. The dimensions and thickness of the TPE layer 108 are a design choice and can be selected according to different purposes.

Figure 1E:
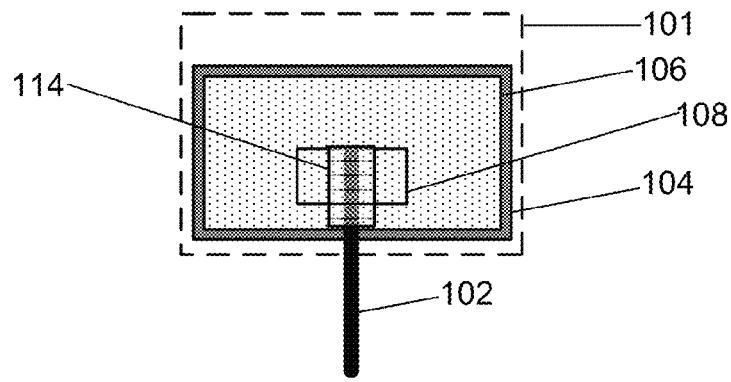
FIG. 1E is a top view illustrating a TPE layer disposed over an electrical wire, according to one embodiment.
Figure 1F:
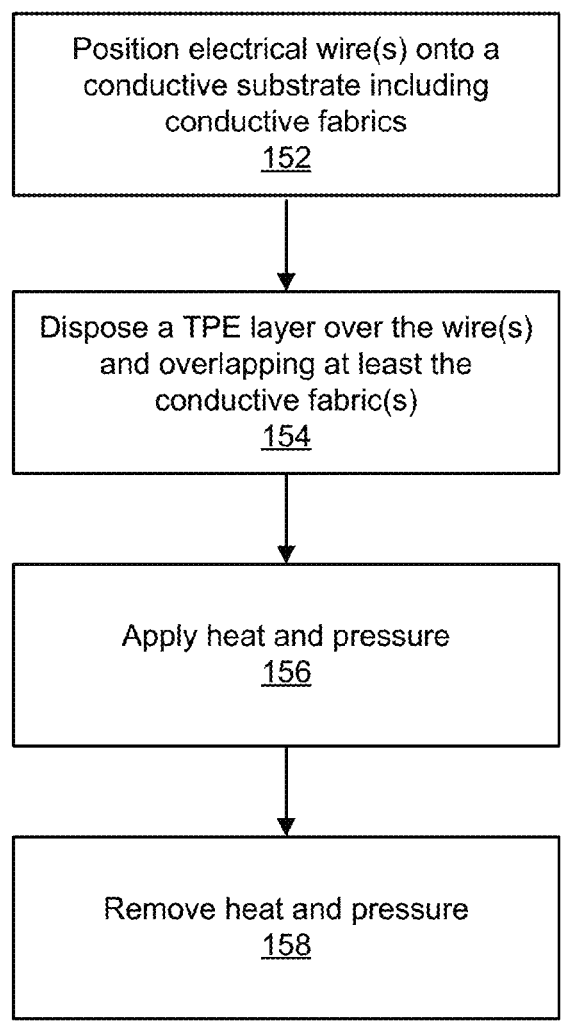
FIG. 1F is a flow chart of an example process of bonding electrical wires to flexible conductive elements of a conductive substrate, according to one embodiment.

The TPE layer 108 preferably is wide enough (i.e., in the right-left direction on FIG. 1B) to conform to the exterior of the electrical wire 102 and extends sufficiently beyond the wire to bond to the conductive substrate 101 (i.e., to the insulating layer 104 in this example). The TPE layer 108 preferably also is long enough (i.e., in the direction into the paper on FIG. 1B) to cover the segment of the electrical wire 102 that is to be electrically connected to the conductive fabric element 106, for example, as illustrated in FIG. 1E. FIG. 1E illustrates a top view of a TPE layer 108 disposed over a wire 102 and over a conductive substrate 101. In the illustrated example, the TPE layer 108 is the same length as the segment of the electrical wire 102 to be electrically connected to the conductive fabric element 106. In some embodiments, the TPE layer 108 is preferably of the same width as the conductive fabric element 106. In some embodiments, the TPE layer 108 is preferably of the same length as the segment of the electrical wire 102 that overlaps the conductive fabric element 106. A segment of an electrical wire that is to be electrically connected to a conductive fabric element is hereinafter referred to as a "wire segment." A wire segment can be straight as illustrated in FIG. 1E. A wire segment can also be looped, curved, or shaped in other forms. In some embodiments, a length of a wire segment is in the range of 1 to 1.5 cm (centimeter).

In some embodiments, a wire stiffener is disposed onto a TPE layer 108, for example, onto a surface (e.g., the surface 110) that is opposite the electrical wire 102. The wire stiffener can be disposed onto the TPE layer 108 by using an adhesive. In some embodiments, an adhesive layer is disposed onto the TPE layer 108, for example, a surface (e.g., the surface 110) that is opposite the electrical wire 102 and a wire stiffener is disposed onto the adhesive layer. The wire stiffener or the adhesive layer can be disposed onto the TPE layer 108 before or after the TPE layer 108 is disposed over the electrical wire 102. The wire stiffener is positioned to overlap the electrical wire 102 as further described below with respect to FIG. 1E. The wire stiffener provides additional mechanical structural support for encapsulating the electrical wire 102 and prevents the electrical wire 102 from breaking its encapsulation, especially, under repeated flexing. A wire stiffener is made of materials such as polyesters, Mylar plastic, and the like.

As illustrated in FIG. 1E, a wire stiffener 114 is disposed over the TPE layer 108 and overlaps the electrical wire 102. The wire stiffener 114 preferably is wide enough to conform to the exterior of the electrical wire 102. For example, for an electrical wire having a diameter of 1 mm, a wire stiffener may be 10-15 mm wide. The wire stiffener 114 preferably is long enough to cover the segment of the electrical wire 102 that is to be electrically connected to the conductive fabric element 106. In some embodiments, the TPE layer 108 extends beyond the segment of the electrical wire 102 that is to be electrically connected to the conductive fabric element 106. As illustrated, the wire stiffener 114 is longer than the TPE layer 108. An assembly to form electrical connections is created.

FIGS. 1C through 1D are described together. In this example, the segment of the electrical wire 102 to be electrically connected to the conductive fabric element 106 is exposed. Heat and pressure are applied 156 to the assembly, for example, by using a heat press. The assembly includes the conductive substrate 101, the electrical wire 102, and the TPE layer 108. The assembly sometimes further includes a wire stiffener or an adhesive layer. As illustrated in FIG. 1C, heat and pressure are applied through the TPE layer 108. Heat and pressure can be additionally or alternatively applied through the conductive substrate 101, through the wire stiffener, or through the adhesive layer. The applied heat and pressure heats up the electrical wire 102 and pushes the electrical wire 102 towards the insulating layer 104. If the electrical wire 102 is stripped, the exposed conductor melts through the insulating layer 104 and an outer surface of the electrical wire 102 makes contact with the conductive fabric element 106, as illustrated in FIG. 1D. Because both the conductive fabric element 106 and the electrical wire 102 are conductive, an electrical connection 111 is formed. The melted portion of the insulating layer 104 reflows around the electrical wire 102. The TPE layer 108 conforms to an exterior of the electrical wire 102 and also bonds to the insulating layer 104, as illustrated in FIG. 1D. The melted portions of the TPE layer 108 and of the insulating layer 104 mix and re-solidify when cooled thereby to create a bond. In addition, adhesives of the TPE layer 108 further bond the TPE layer 108 to the conductive substrate 101. In some embodiments, the temperature used is in the range of 300 to 350 F. In some embodiments, the pressure used is in the range of 4 to 20 psi.

The heat and pressure is then removed 158. The TPE layer 108 shrinks during cooling, clamping onto the electrical wire 102 and securely fixing the electrical connection 111 between the electrical wire 102 and the conductive fabric element 106. Because the electrical wire 102 is in direct contact with the conductive fabric element 106, the overall connection is thin, low resistance, light in weight, flexible, and structurally strong. The bonding area is slightly stiffer than the other areas and prevents electrical connections from breaking. In some embodiments, heat and pressure is applied for at least 30 seconds before it is removed.

In some embodiments, the electrical wire 102 is not exposed and still has an outer jacket. The material and/or a thickness of the wire jacket can be selected, so that the heat and pressure causes the conductor to melt through the wire jacket and the insulating layer 104, in order to form an electrical connection between the electrical wire 102 and the conductive fabric element 106.

In other embodiments, other techniques such as ultrasonic welding, an air bladder with a strip heating element, or induction heating are used to apply heat and pressure instead of a heat press.

Additionally, in some embodiments, the positioning and the disposing as described in connection with FIGS. 1A through 1F can be performed in a different order. For example, electrical wires can be positioned onto the TPE layer before disposing the assembly over the conductive substrate. As another example, electrical wires are positioned onto the TPE layer before disposing the conductive substrate onto the assembly.

While only one electrical wire 102 and one conductive fabric element 106 are shown in FIG. 1, the techniques described can also be used to simultaneously form multiple electrical connections between one or more electrical wires and conductive fabric elements. For example, the conductive substrate may include an array of conductive fabric elements, with a corresponding array of electrical wires to be connected to the conductive fabrics. The electrical wires are positioned onto the insulating layer. Each of the electrical wires is positioned relative to the corresponding fabric element, according to the description provided with respect to FIG. 1. Tooling can position multiple wires onto the conductive substrate, either simultaneously or sequentially.

As one example, the process can simultaneously form multiple electrical connections between multiple wire segments and one or more conductive fabric elements which are part of a conductive substrate. The conductive substrate includes a conductive fabric layer and an insulating layer disposed on the conductive fabric layer. The conductive fabric layer includes the one or more conductive fabric elements. The multiple wire segments can belong to one wire or multiple different wires.

To create an assembly to form the electrical connections, the multiple wire segments are positioned onto a surface of the insulating layer that is opposite the conductive fabric layer. A TPE layer is disposed over the wire segments and overlaps the conductive fabric layer. In some embodiments, the TPE layer includes one single TPE element that overlaps all of the wire segments. In some embodiments, the TPE layer includes multiple TPE elements, and each TPE element overlaps one or more of the wire segments. One or more wire stiffeners may be further disposed onto the TPE layer and overlap one or more of the wire segments. An adhesive layer may be further disposed onto the TPE layer.

Heat and pressure are applied to the assembly to simultaneously form multiple electrical connections. Heat and pressure can be applied through the TPE layer, through the conductive substrate, through the wire stiffeners, and/or through the adhesive layer. The applied heat and wire heat up the wire segments and push the wire segments towards the insulating layer. The wire segments melt through the insulating layer and outer surfaces of the wire segments make contact with the conductive fabric layer. As such, electrical connections between the wire segments and the one or more conductive fabric elements are formed. The melted portion of the insulating layer reflows around the wire segments. The TPE layer conforms to exteriors of the wire segments and also bonds to the insulating layer of the conductive substrate. The TPE layer 108 shrinks during cooling, clamping onto the wire segments and securely fixing the electrical connections between the wire segments and the one or more conductive fabric elements.

By using the processes described herein, a single electrical wire can make one or more electrical connections with a conductive fabric layer that includes one or more conductive fabric elements. A conductive fabric element can make one or multiple electrical connections with a single electrical wire. Multiple conductive fabric elements can make multiple electrical connections with a single electrical wire. Or, multiple conductive fabric elements can make multiple electrical connections with multiple electrical wires. In some embodiments, each conductive fabric element makes one electrical connection with one of the wire segments. In some embodiments, each conductive fabric element makes electrical connections with at least two of the wire segments.

Electrical connections between multiple electrical wires and a single conductive fabric element, between a single wire and multiple conductive fabric elements, between a single wire and a single conductive fabric element at multiple locations can be formed simultaneously. The electrical connections can also be made at any point on the electrical wire and at any point on the conductive fabric elements. Example assemblies for simultaneously forming multiple electrical connections are further described below with respect to FIGS. 2A through 2C.

Figure 2A:
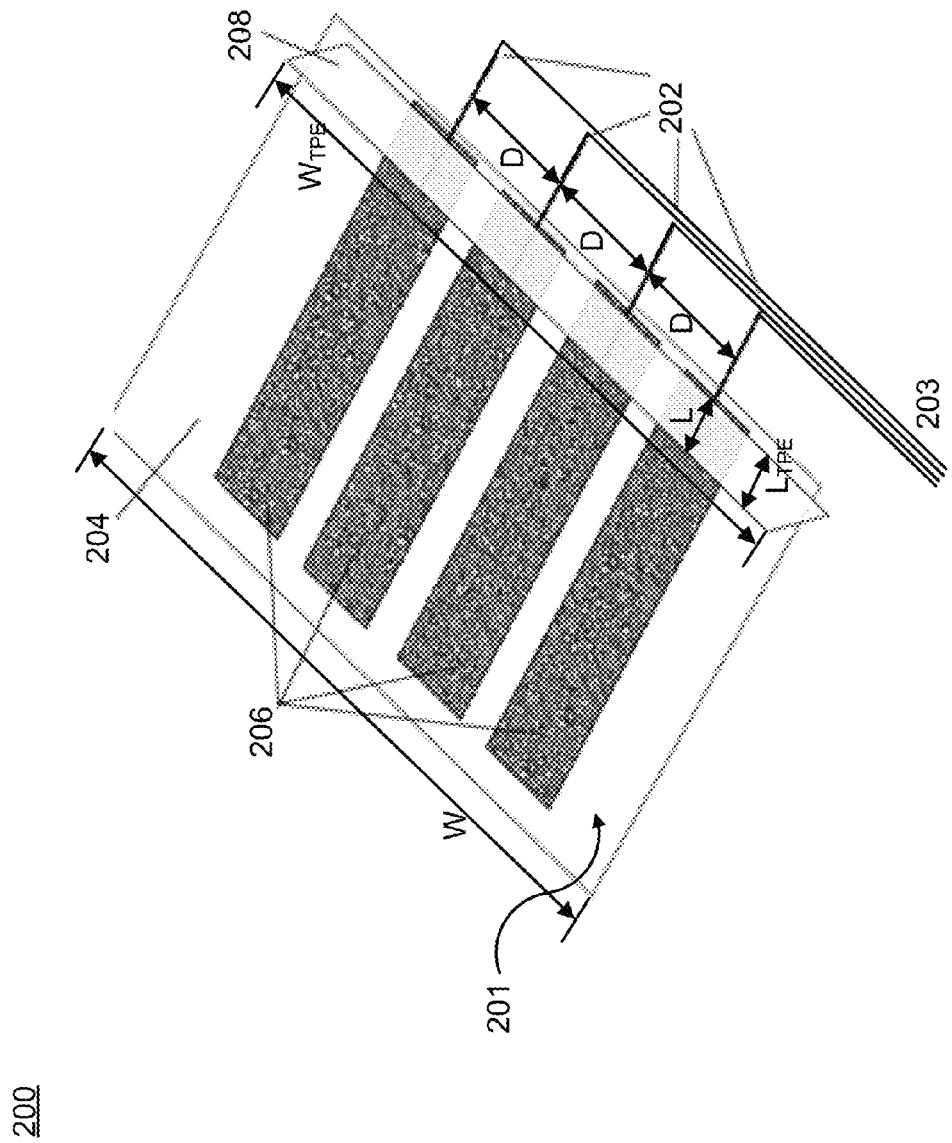
FIG. 2A is a perspective view of an example assembly to form electrical connections between electrical wires and a conductive substrate, according to one embodiment.

FIG. 2A is a perspective view of an example assembly to form electrical connections between electrical wires 202 and a conductive substrate 201, according to one embodiment. As illustrated, the TPE layer 208 is disposed over electrical the electrical wires 202 and conductive substrate 201. In this example, the conductive substrate 201 includes four conductive fabric elements 206 that are laminated at even spacings onto the insulating layer 204. The four conductive fabric elements 206 are strips of fabric that are parallel to each other with their front edges aligned. Adjacent conductive fabric elements 206 are separated by a pitch D, and each strip 206 has a width that is less than D so that adjacent conductive fabric elements 206 do not touch each other. In some embodiments, a pitch is in a range of 0.2 to 1.25 inches.

Four electrical wires 202 are positioned onto the conductive substrate 201 such that an electrical wire 202 is positioned along the middle of a corresponding conductive fabric element 206. In this particular example, there is a one-to-one relationship between the conductive fabric elements 206 and the electrical wires 202. In addition, each electrical wire 202 overlaps the corresponding conductive fabric 206 for the same length L.

A single TPE layer 208 covers all four conductive fabric elements 206 and all four electrical wires 202. The TPE layer 208 has a width $W_{TPE}$ sufficient to overlap all of the electrical wires 202 and fabric strips 206. The TPE layer 208 has a length $L_{TPE}$ sufficient to cover the exposed wire length.

In one approach, the TPE layer 208 has the same width W as the conductive substrate 201 and has the same length L as the wire segments 202 overlapping the conductive fabric elements 206. The right and left edges of the TPE layer 208 are aligned with the sides of the conductive substrate 201, and the front edge of the TPE layer 208 is aligned with the front edges of the conductive substrate 201 and the conductive fabric elements 206. The electrical wires 202 may be part of a ribbon cable 203 or other cable to facilitate connection to other electrical devices.

Figure 2B:
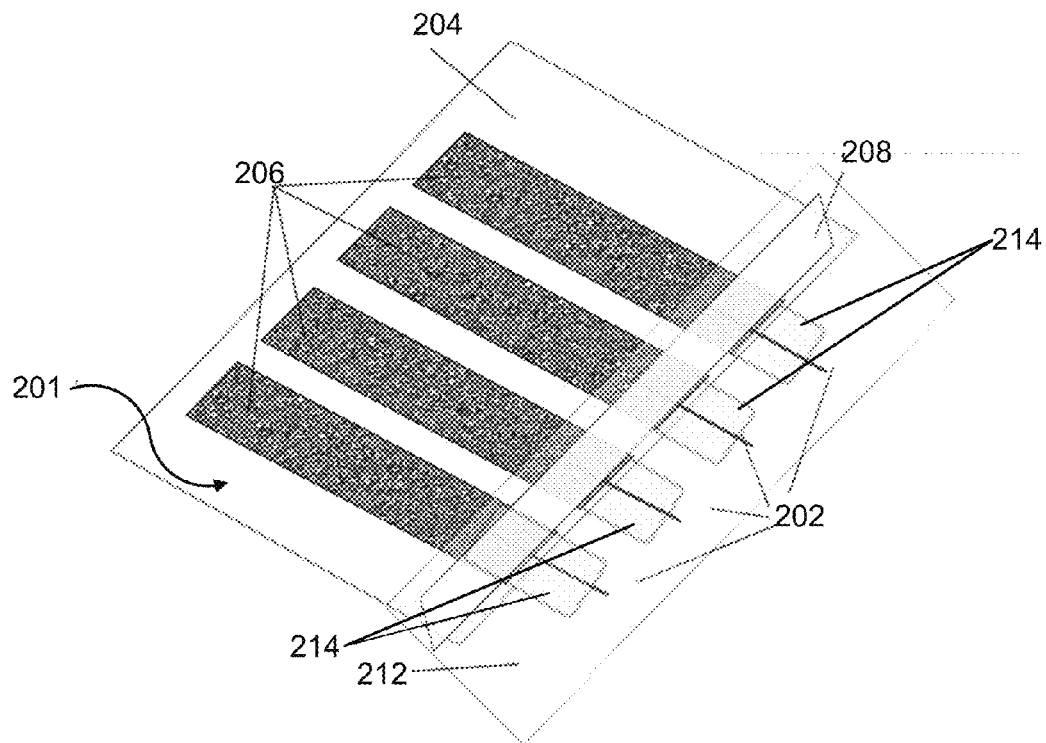
FIGS. 2B-2C are a perspective view and a cross-sectional view of an example assembly to form electrical connections between electrical wires and a conductive substrate, according to one embodiment.
Figure 2C:
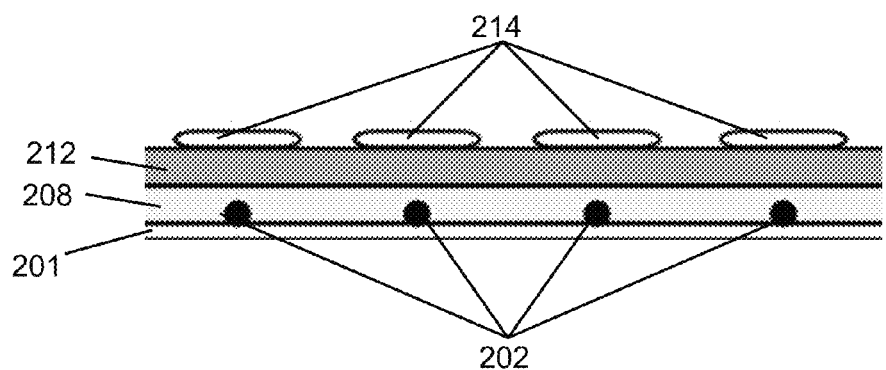

FIG. 2B is a perspective view of an example assembly to form electrical connections between electrical wires 202 and a conductive substrate 201, according to one embodiment. FIG. 2C is a corresponding cross-sectional view of the example assembly. FIGS. 2B and 2C are described together. The assembly 250 is similar to the assembly 200 illustrated in FIG. 2A and description related to the conductive substrate 201, electrical wires 202, insulating layer 204, conductive fabric elements 206, TPE layer 208 are omitted herein. Compared to the assembly 200 illustrated in FIG. 2A, the assembly 250 additionally includes wire stiffeners 214 and a adhesive layer 212. The adhesive layer 212 includes a double-sided adhesive disposed over the TPE layer 208 and the wire stiffeners 214 are disposed onto the adhesive layer 212. The adhesive layer 212 can be used as a carrier for the TPE layer 208. As illustrated, the wire stiffeners 214 are positioned such that a corresponding electrical wire 202 is centered along the middle of a wire stiffener 214. In this particular example, there is a one-to-one relationship between the wire stiffener 214 and the electrical wires 202. A wire stiffener 214 extends beyond the segment of an electrical wire 202 that overlaps the conductive fabric element 206.

Figure 3:
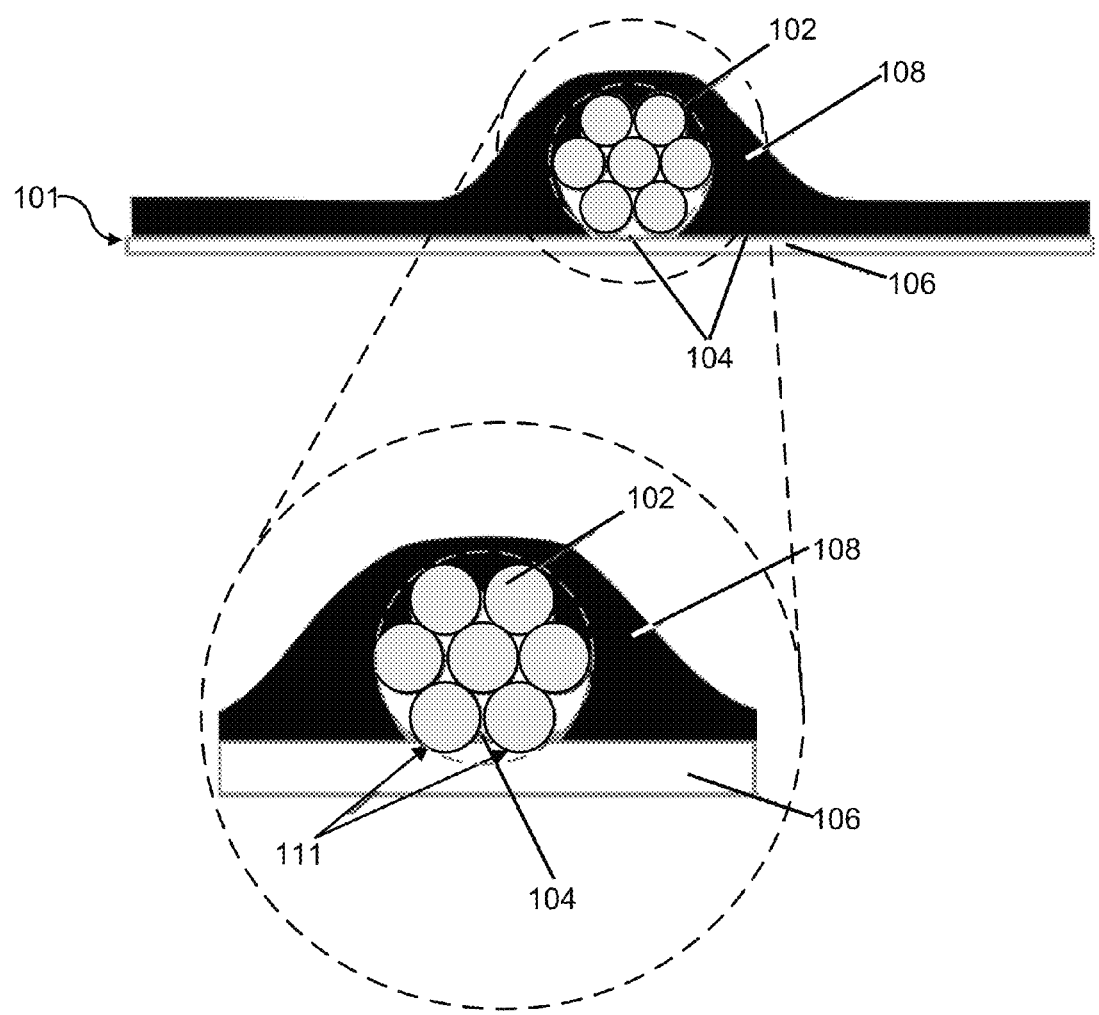
FIG. 3 illustrates a cross-sectional view of an electrical wire electrically connected to a conductive substrate, according to one embodiment.

FIG. 3 illustrates a cross-sectional view of a 7-stranded electrical wire 102 electrically connected to a conductive substrate 101 using a process as previously described in connection with FIGS. 1A through 1F. The electrical wire 102 is securely affixed to the conductive substrate 101, making a reliable electrical contact with the conductive fabric element 106. In FIG. 3, the white rectangle is the conductive fabric element 106, the black region is the TPE layer 108, and the insulating layer 104 is a thin gray layer above the conductive fabric element 106.

Preferably, the temperature and pressure are selected to regulate the reflow of melted TPE layer 108. The melted portion of the TPE layer has a relative high viscosity and preferably does not reflow into the voids in the interior of the strands. However, the TPE layer 108 preferably does reflow so as to encapsulate the strands, conforming to the outer surfaces of the stranded wire. In this way, because the exterior shape of the wire is not perfectly round and because the strands are twisted along the length of the wire, the reflowed TPE layer 108 clamps the strands securely and the original relative positions of the strands are maintained. The amount of encapsulation ensures that there is little to no movement of the electrical wire 102 or any individual strand with respect to the conductive fabric element 106, thereby ensuring consistent electrical contact, even during bending and flexing. As illustrated in the enlarged view of FIG. 3, the bottom strands make electrical contact 111 with the conductive fabric element 106.

Figure 4A:
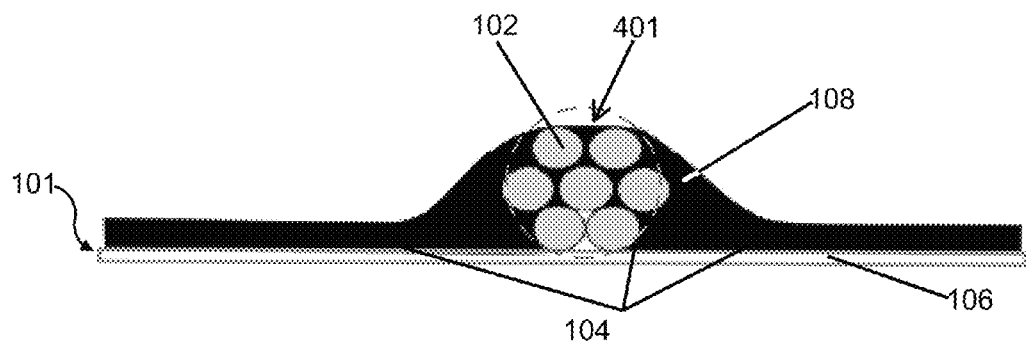
FIGS. 4A through 4C illustrate cross-sectional views of less desirable electrical connections.
Figure 4B:
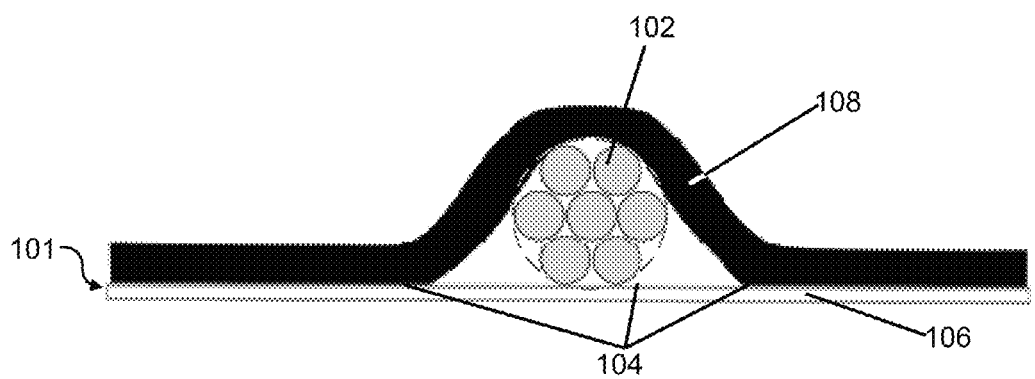
Figure 4C:
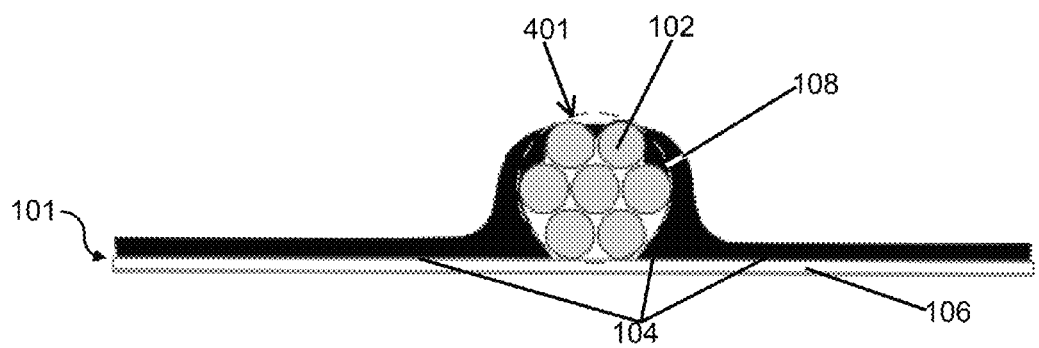

FIGS. 4A through 4C illustrate cross-sectional views of less desirable electrical connections. In the example illustrated in FIG. 4A, a high temperature and/or a high pressure were used. A high temperature can cause potential thermal damage to conductive substrates. In addition, as illustrated, the TPE layer 108 has reflowed into the gaps between the strands. A high temperature or pressure can cause this. A high temperature can cause a viscosity of the melted TPE to drop significantly, which can force the melted TPE to press the strands inward and loosen the strands, creating larger gaps between them. As a result, the melted TPE can reflow through the gaps between the strands, even under a low pressure. A high pressure can also loosen the strands and cause the molten TPE to reflow between the strands regardless of the temperature applied. Because the TPE layer 108 is made of non-conductive materials, electrical conductivity between the strands are weakened when the molten TPE reflows between the strands. Thus, a high temperature and/or pressure can weaken electrical connections between the strands. Similarly, under a high temperature and/or pressure, the melted TPE may also reflow between the strands and the conductive fabric element, resulting in a poor electrical connection. Additionally, if the melted TPE is not viscous enough or if too much pressure is applied, wires may be exposed completely or covered by a thin TPE top layer 401 that is likely to break exposing the wires.

In the example illustrated in FIG. 4B, a low temperature was used. The TPE layer 108 is not sufficiently melted and has a high viscosity. As a result, as illustrated, the TPE layer 108 does not conform to the outer surfaces of the wires and thus the strands 108 are loosely bonded to the conductive substrate 101. The individual strands are likely to move relative to each other and relative to the other components of the assembly. This can cause varying resistances when the assembly is being flexed. The wires are also likely to slide out from the encapsulation. A low temperature may also cause a failure to melt through the insulating layer 104, resulting in the wire 102 not making electrically contact with the conductive fabric 106.

In the example illustrated in FIG. 4C, for the combination of temperature and pressure that was used, the TPE layer 108 is too thin and/or the wire 102 is too thick. In either case, there is not enough TPE material 108 to encapsulate the top 401 of the wire. Again, the wire may likely slide out from the encapsulation.

Figure 5:
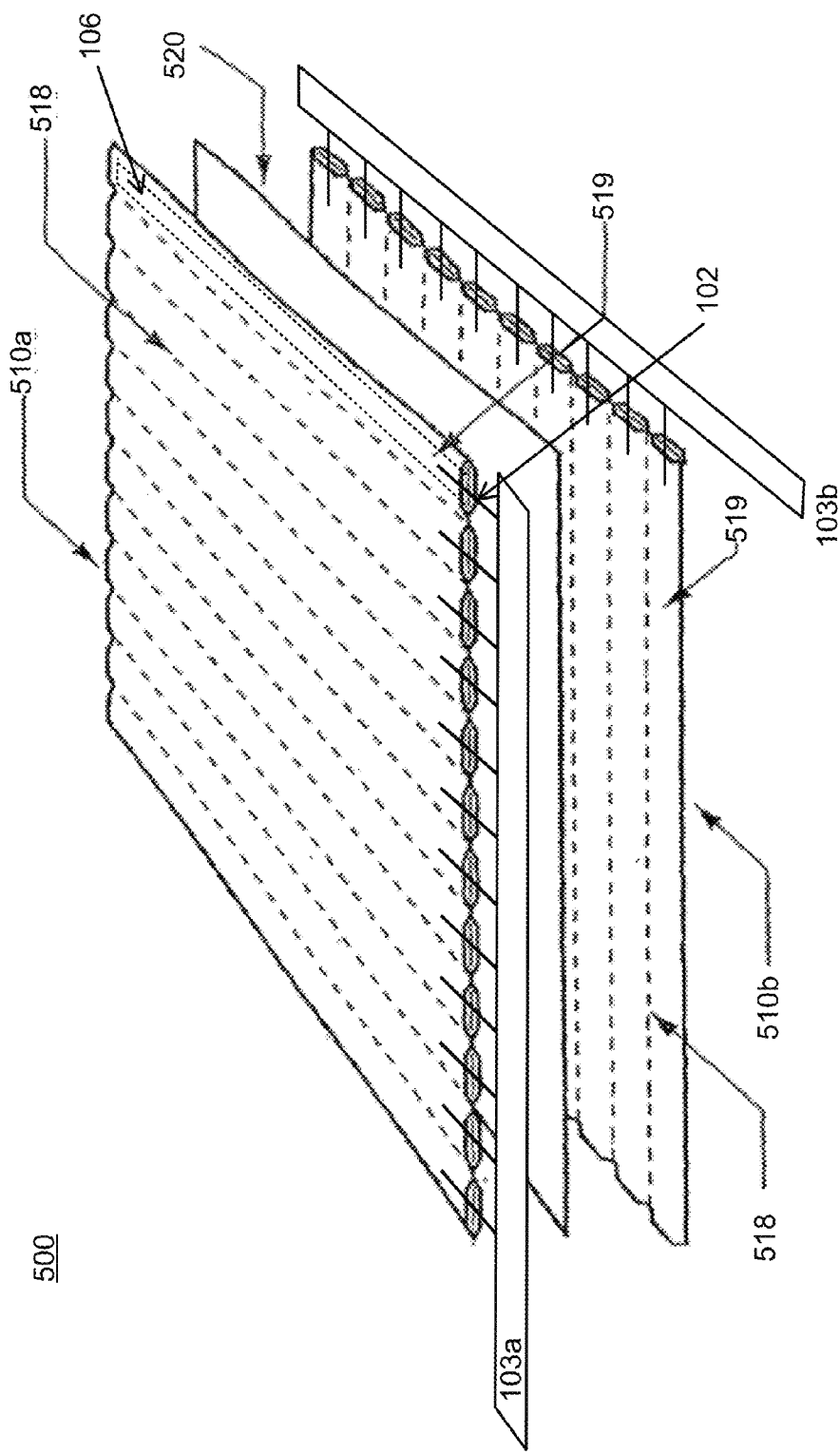
FIG. 5 is an example capacitive pressure sensor in which conductive fabrics are bonded to electrical wires, according to one embodiment.

The connection assemblies described above can be used in many applications. FIG. 5 is an example of a capacitive pressure sensor 500 in which conductive fabrics are bonded to electrical wires, according to one embodiment. The illustrated capacitive pressure sensor 500 is a two-dimensional capacitive grid formed by layering two conductive substrates 510a, 510b. Conductive substrate 510a includes an array of conductive fabric stripes 106 that are laminated between a top and bottom insulating layer which forms a pocket 519 for the stripes 106. The outline of the rightmost fabric stripe 106 is shown by the dotted lines in FIG. 5. The large dashed lines show the boundaries between stripes 106. Wires 102 are bonded to the fabric stripes 106 using the process described above. These wires 102 are collected into a cable 103a, which can be connected to a computer. Conductive substrate 510b has a similar construction, using cable 103b.

The two substrates 510a, 510b are positioned such that the conductive fabric elements 106 of one layer are substantially orthogonal to those of the other. In the illustrated example, the capacitive pressure sensor 500 further includes a dielectric sheet 520 that separates the two conductive layers 510a, 510b. The dielectric sheet 520 further insulates the two conductive layers.

Within each pocket 519, a dielectric strip may be encapsulated in addition to the conductive fabric element 106. In this case, the dielectric sheet 520 is optional. In the illustrated example, dashed lines indicate seals formed between an upper insulating layer and a lower insulating layer of pockets used for separating conductive fabric elements 106. These seals may be formed by any suitable method, such as by the use of adhesives, solvent chemical bonding, heat bonding such as impulse heat sealing or RF welding, or ultrasonic bonding. It is not required that the seal be a hermetic seal or fluid-tight. It is only required that the seal creates a physical barrier to lateral movement of the conductors and maintains them in their parallel configuration.

Other applications will be apparent. The process as described herein can be applied to bond other materials and form other types of connections. For example, the process can be applied to bond aluminum conductors, Indium Tin Oxide (ITO) that is widely used in displays, PEDOT:PSS, or PEDOT.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure. The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A device comprising:
   a conductive substrate comprising a conductive fabric element and an insulating layer disposed on the conductive fabric element;
   an exposed wire melted through the insulating layer to make an electrical connection with the conductive fabric element; and
   a thermoplastic elastomer layer disposed over the exposed wire and overlapping the conductive fabric element, the thermoplastic elastomer layer conforming to an exterior of the exposed wire and to bond the thermoplastic elastomer layer to the conductive substrate, thereby securely fixing the electrical connection between the exposed wire and the conductive fabric element.

2. A method of forming an electrical connection between a wire and a conductive substrate, the conductive substrate comprising a conductive fabric element and an insulating layer disposed on the conductive fabric element, the method comprising:
   creating an assembly comprising:
      positioning the wire onto a surface of the insulating layer that is opposite the conductive fabric element, and
      disposing a thermoplastic elastomer layer over the wire and overlapping the conductive fabric element; and
   applying heat and pressure to the assembly, the wire melting through the insulating layer to make an electrical connection with the conductive fabric element, and the thermoplastic elastomer layer conforming to an exterior of the wire and bonding to the conductive substrate thereby securely fixing the electrical connection between the wire and the conductive fabric element.

3. The method of claim 2, wherein a segment of the wire that makes the electrical connection with the conductive fabric element is exposed when positioned onto the surface of the insulating layer.

4. The method of claim 2, wherein a segment of the wire that makes the electrical connection with the conductive fabric element is covered by a wire jacket when positioned onto the surface of the insulating layer, and the wire also melts through the wire jacket when heat and pressure are applied to the assembly.

5. The method of claim 2, wherein creating the assembly further comprises disposing a wire stiffener onto a surface of the thermoplastic elastomer layer and positioned to overlap the wire.

6. The method of claim 2, further comprising removing the heat and pressure after a predetermined time interval.

7. The method of claim 2, wherein the heat and pressure is applied through the thermoplastic elastomer layer.

8. The method of claim 2, wherein the heat and pressure is applied through the conductive substrate.

9. The method of claim 2, wherein applying heat and pressure comprises using a heat press or an ultrasonic welder to apply the heat and pressure.

10. The method of claim 2, wherein the insulating layer is made of polyurethane.

11. The method of claim 2, wherein a surface of the thermoplastic elastomer layer is adhesive.

12. The method of claim 2, wherein the electrical connection is between a straight segment of the wire and the conductive fabric element.

13. The method of claim 2, wherein the electrical connection is between a looped segment of the wire and the conductive fabric element.

14. A method of simultaneously forming multiple electrical connections between multiple wire segments and a conductive substrate, the conductive substrate comprising a conductive fabric layer and an insulating layer disposed on the conductive fabric layer, the method comprising:
positioning the multiple wire segments onto a surface of the insulating layer that is opposite the conductive fabric layer;
disposing a thermoplastic elastomer layer over the wire segments and overlapping the conductive fabric layer to create an assembly; and
applying heat and pressure to the assembly, the wire segments melting through the insulating layer to make electrical connections with the conductive fabric layer, and the thermoplastic elastomer layer conforming to exteriors of the wire segments and bonding to the conductive substrate thereby securely fixing the electrical connections between the wire segments and the conductive fabric layer.

15. The method of claim 14, wherein the thermoplastic elastomer layer consists of a single thermoplastic elastomer element that overlaps all of the wire segments.

16. The method of claim 14, wherein the thermoplastic elastomer layer comprises two or more thermoplastic elastomer elements overlapping the wire segments.

17. The method of claim 14, wherein the multiple wire segments comprise multiple wires, each wire making a single electrical connection with the conductive fabric layer.

18. The method of claim 14, wherein at least two of the wire segments are different parts of a single wire, the single wire making more than one electrical connection with the conductive fabric layer.

19. The method of claim 14, wherein the conductive fabric layer comprises multiple conductive fabric elements, each making electrical connection with one of the wire segments.

20. The method of claim 14, wherein the conductive fabric layer comprises at least one conductive fabric element that makes electrical connection with two or more of the wire segments.

* * * * *